(12) United States Patent
Jung et al.

(10) Patent No.: US 9,418,760 B2
(45) Date of Patent: Aug. 16, 2016

(54) INTEGRATED CIRCUIT AND METHOD FOR TESTING SEMICONDUCTOR DEVICES USING THE SAME

(71) Applicant: SK hynix Inc., Gyeonngi-do (KR)

(72) Inventors: Woo-Sik Jung, Gyeonggi-do (KR); Weon-Seon Lee, Gyeonggi-do (KR); O-Han Kwon, Gyeonggi-do (KR); In-Tae Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 150 days.

(21) Appl. No.: 14/513,042

(22) Filed: Oct. 13, 2014

(65) Prior Publication Data

US 2015/0286547 A1 Oct. 8, 2015

(30) Foreign Application Priority Data

Apr. 8, 2014 (KR) .................. 10-2014-0041815

(51) Int. Cl.
*G06F 11/00* (2006.01)
*G11C 29/44* (2006.01)
*G11C 29/12* (2006.01)
*G01R 31/3193* (2006.01)

(52) U.S. Cl.
CPC .......... *G11C 29/44* (2013.01); *G01R 31/31935* (2013.01); *G11C 2029/1208* (2013.01); *G11C 2029/4402* (2013.01)

(58) Field of Classification Search
CPC  G11C 29/44; G11C 29/4402; G06F 11/0781; G06F 11/0787; G06F 11/079
See application file for complete search history.

(56) References Cited

U.S. PATENT DOCUMENTS

| 2009/0105982 | A1* | 4/2009 | Sarig | G06F 11/0748 702/108 |
| 2009/0193302 | A1* | 7/2009 | Bingo | G11C 29/40 714/718 |
| 2011/0154091 | A1* | 6/2011 | Walton | G06F 11/0712 714/2 |
| 2012/0127813 | A1* | 5/2012 | Jeong | G11C 29/44 365/200 |
| 2014/0122932 | A1* | 5/2014 | Chen | G06F 11/079 714/37 |

FOREIGN PATENT DOCUMENTS

KR  1020100085657  7/2010

* cited by examiner

*Primary Examiner* — Michael Maskulinski
(74) *Attorney, Agent, or Firm* — IP & T Group LLP

(57) ABSTRACT

An integrated circuit includes first to third failure information storage units, an input selection unit suitable for alternately storing plural pieces of failure information in the first and second failure information storage units generated whenever each of a plurality of tests is performed on a device under test (DUT), and a storage selection unit suitable for relocating the plural pieces of failure information from the first or second failure information storage unit that was not selected by the input selection unit, to the third failure information storage unit while excluding overlapping failure information from relocating.

20 Claims, 9 Drawing Sheets

FIG. 1
(PRIOR ART)

| COLUMN ADDRESS | ROW ADDRESS |
|---|---|
| 1 | 2 |
| 4 | 4 |
| 7 | 8 |
| 1 | 2 |
| 4 | 4 |
| 7 | 8 |
| | |
| | |
| | |
| | |
| | |
| | |

DIRECTLY STORE FAILURE ADDRESS VALUES AND REPETITIVELY STORE SAME FAILURE
SIZE = NUMBER OF FAILURES X WORD X READ COUNT
(WORD = BIT NUMBER REQUIRED FOR REPRESENTING ADDRESS)
ex) 2k bit FAILURE, word=32bit, read 6times
size = 384Kb/DUT

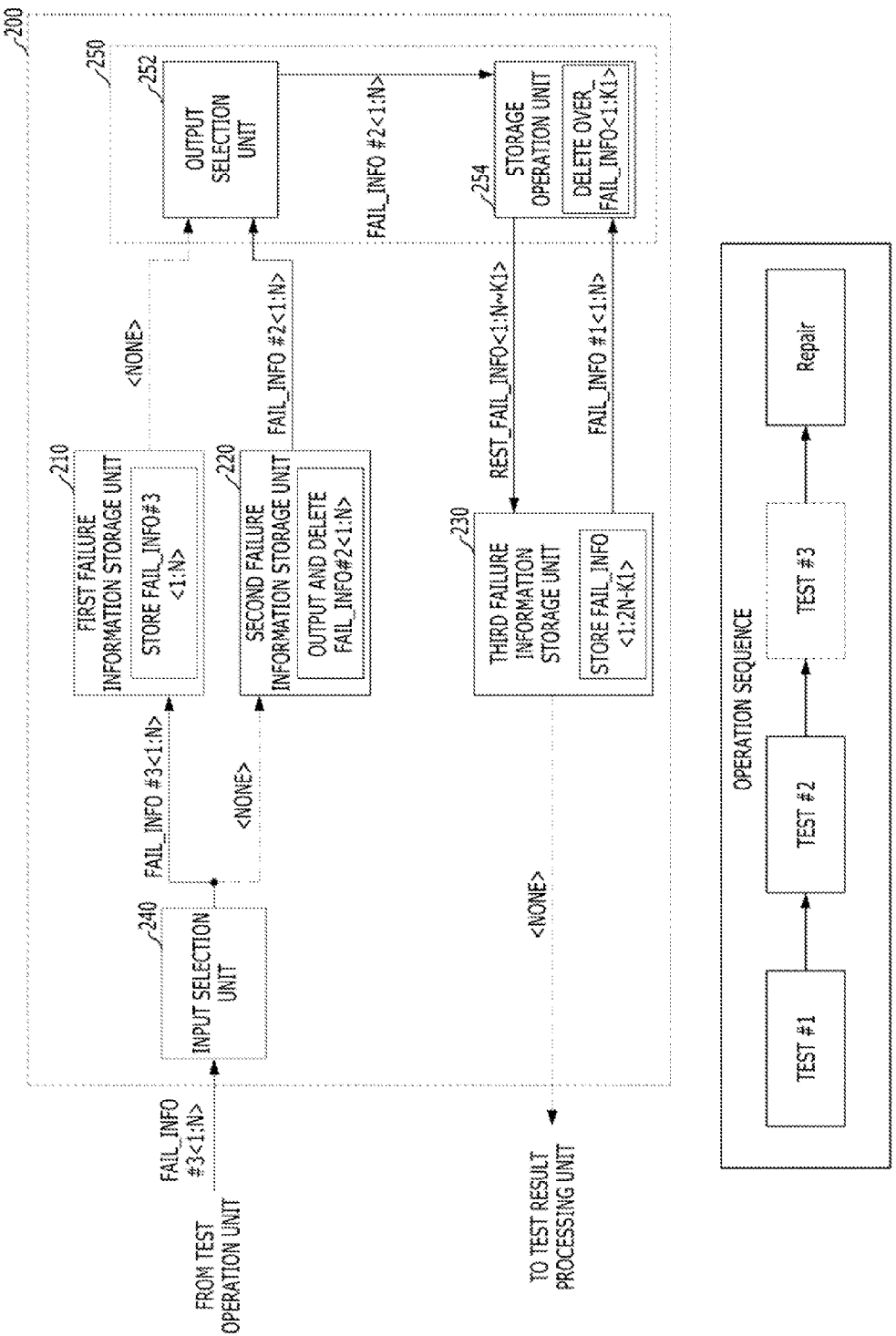

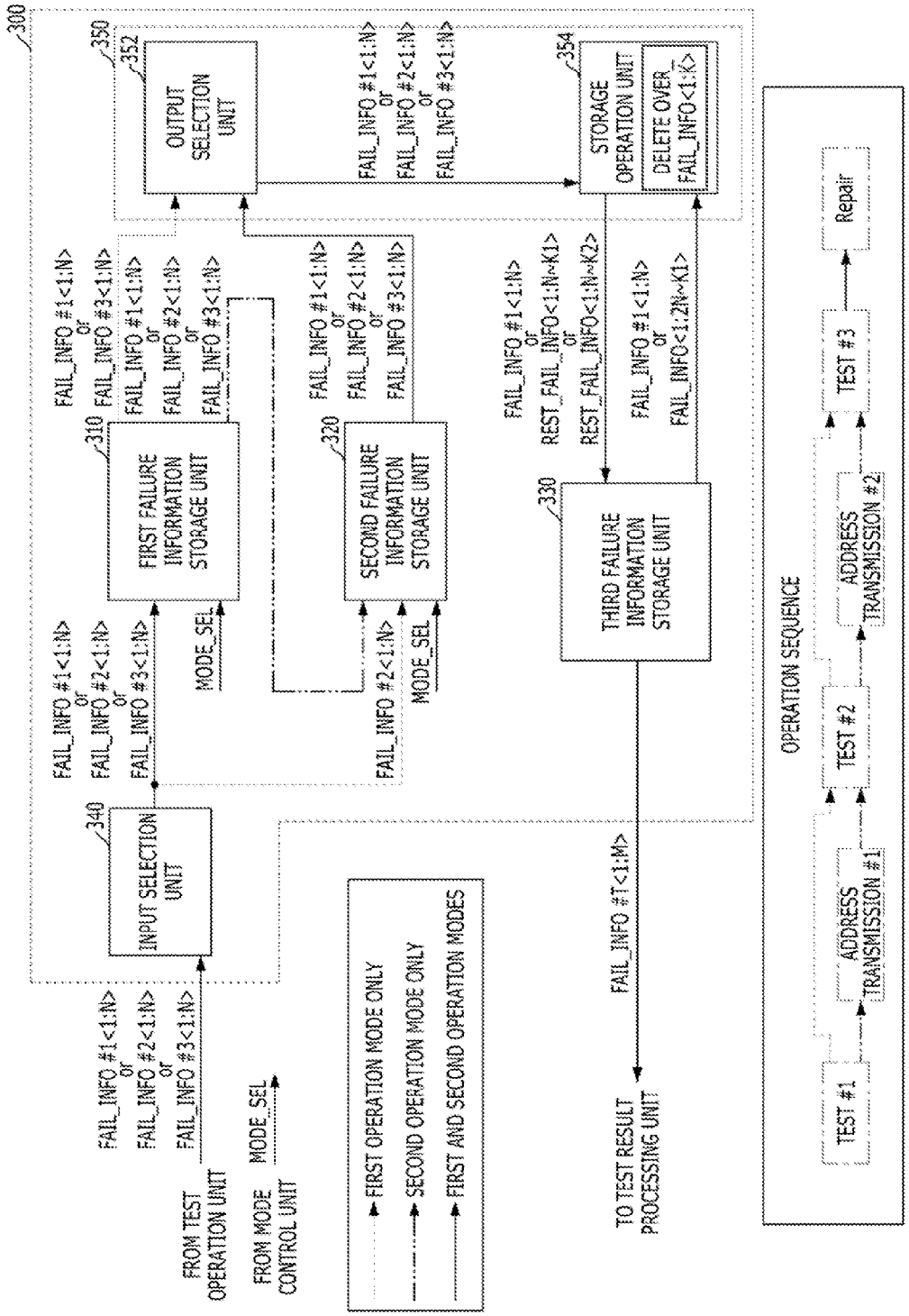

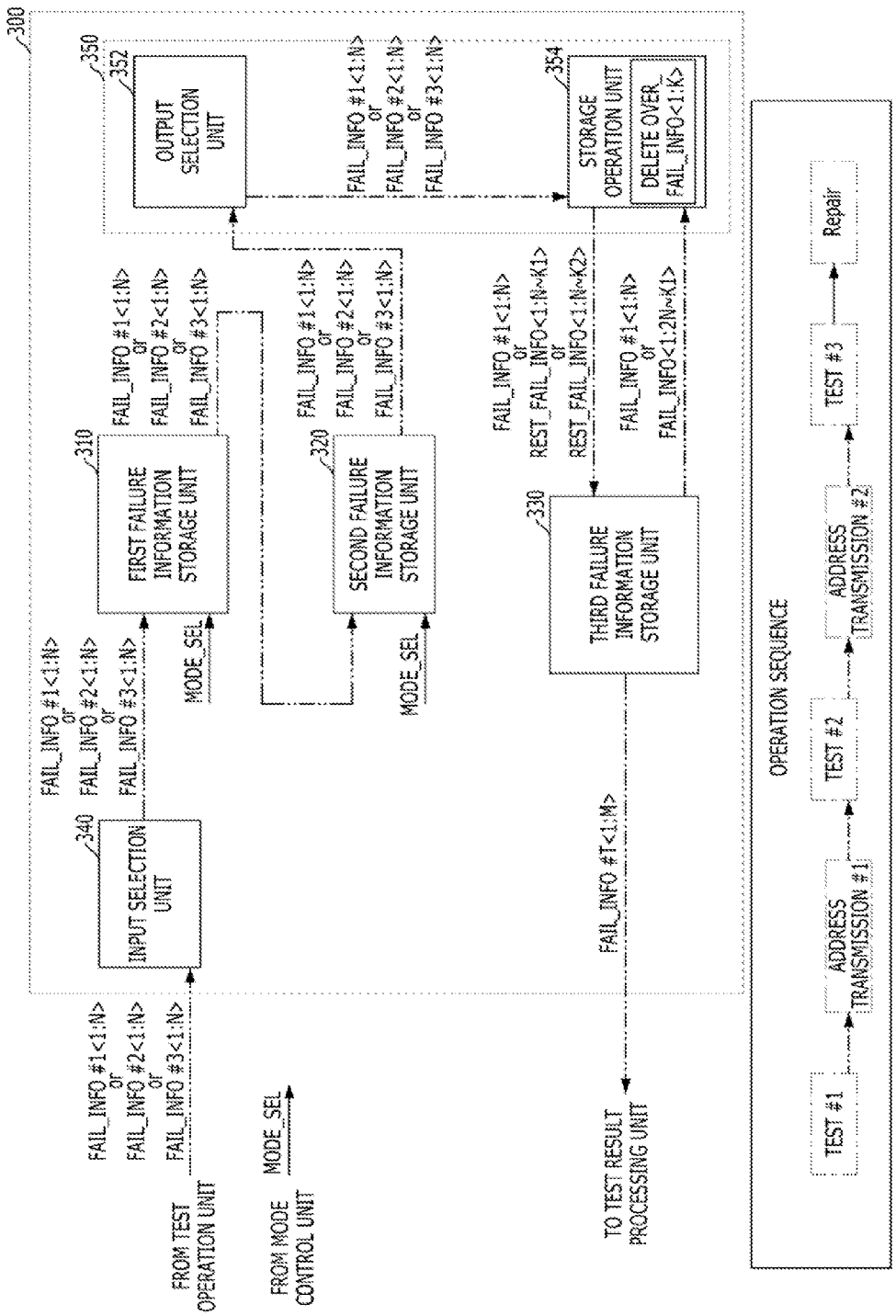

US 9,418,760 B2

INTEGRATED CIRCUIT AND METHOD FOR TESTING SEMICONDUCTOR DEVICES USING THE SAME

CROSS-REFERENCE TO RELATED APPLICATIONS

The present application claims priority of Korean Patent Application No. 10-2014-0041815, filed on Apr. 8, 2014, which is incorporated herein by reference in its entirety.

BACKGROUND

1. Field

Various embodiments of the present invention relate to a semiconductor design technology, and more particularly, to testing semiconductor devices.

2. Description of the Related Art

In general, semiconductor devices pass through various types of tests before shipment, and the operations of the semiconductor devices are verified through the tests.

When various types of tests are performed on a semiconductor device, failure information is generated during each of the tests. Based on the failure information, the semiconductor device may be repaired in various manners to correct the failures so that the device performs operations normally.

As described above, various types of tests need to be performed, and various pieces of failure information may be generated whenever one test is performed. However, it may be very inefficient to repair the semiconductor device by immediately providing failure information whenever each test is completed.

Thus, a plurality of tests are sequentially and intensely performed, plural pieces of failure information generated at each of the tests are collectively stored in a specific storage, and repair operations for the respective tests are then performed.

FIG. 1 is a diagram for describing a conventional method for storing test failure information in a storage space included in a tester.

For reference, FIG. 1 illustrates a method for storing information on a plurality of defective memory cells in a semiconductor memory device such as DDR SDRAM. However, this is an example, and various pieces of failure information may occur during a test process for the semiconductor device.

Since a plurality of memory cells are arranged in array, a row address and a column address are needed to specify a defective memory cell in which a failure occurred.

Thus, the conventional method stores a row address and a column address of the defective memory cell in storage of test equipment.

While a plurality of tests are performed on a plurality of memory cells, failure determinations may be repetitively made on the same memory cell.

However, since a plurality of tests are sequentially and intensely performed, row addresses and column addresses of memory cells that fail any of the tests are stored, regardless of whether the respective pieces of failure information overlap each other.

Thus, the row addresses and the column addresses indicating the same memory cells may be repetitively stored. For example, referring to FIG. 1, column/row addresses 1/2, 4/4, and 7/8 are determined to be failure addresses and stored at the first test. Then, column/row addresses 1/2, 4/4, and 7/8 are determined to be failure addresses and stored again at the second test. This occurs since an error is highly likely to repetitively occur in a defective memory cell when applying plural tests.

When plural pieces of failure information generated during the respective tests are repetitively stored, storage space for storing the failure information needs to be increased resulting in the test cost inevitably increasing.

SUMMARY

Various embodiments are directed to an integrated circuit that may minimize the increase of storage space caused by overlapping failure information, when a plurality of tests are sequentially and intensely performed, a tester including the same and an operation method thereof.

In an embodiment of the present invention, an integrated circuit may include: first to third failure information storage units; an input selection unit suitable for alternately storing plural pieces of failure information in the first and second failure information storage units, generated whenever each of a plurality of tests is performed on a device under test (DUT); and a storage selection unit suitable for relocating the plural pieces of failure information from the first or second failure information storage unit that was not selected by the input selection unit, to the third failure information storage unit while excluding overlapping failure information from relocating.

In an embodiment of the present invention, an integrated circuit may include: first to third failure information storage units; an input selection unit suitable for alternately storing plural pieces of failure information in the first and second failure information storage units, generated whenever each of a plurality of tests is performed on a device under test (DUT) in a first operation mode; and a storage selection unit suitable for relocating the plural pieces of failure information from the first or second failure information storage unit that was not selected by the input selection unit, to the third failure information storage unit while excluding overlapping failure information from relocating, during the first operation mode.

In an embodiment of the present invention, there is provided a method of testing a semiconductor device. The method may include: storing plural pieces of failure information in a first failure information storage space, generated whenever an odd-numbered test among a plurality of tests is performed on the semiconductor device; storing plural pieces of failure information in a second failure information storage space, generated whenever an even-numbered test among the plurality of tests is performed on the semiconductor device; relocating the plural pieces of failure information stored in the second failure information storage space to a third failure information storage space while the plural pieces of failure information is stored in the first failure information storage space, wherein overlapping failure information that overlaps the plural pieces of failure information stored in the third failure information storage space is stored only one time; and relocating the plural pieces of failure information stored in the first failure information storage space to the third failure information storage space while the plural pieces of failure information is stored in the second failure information storage space, wherein the overlapping failure information is stored only one time.

BRIEF DESCRIPTION OF THE DRAWINGS

FIG. 1 is a diagram illustrating a conventional method for storing test failure information in a storage space included in a tester.

FIGS. 2A to 2E are diagrams illustrating an integrated circuit in accordance with a first embodiment of the present invention.

FIGS. 3A to 3C are diagrams illustrating an integrated circuit in accordance with a second embodiment of the present invention.

DETAILED DESCRIPTION

Figure 2A:
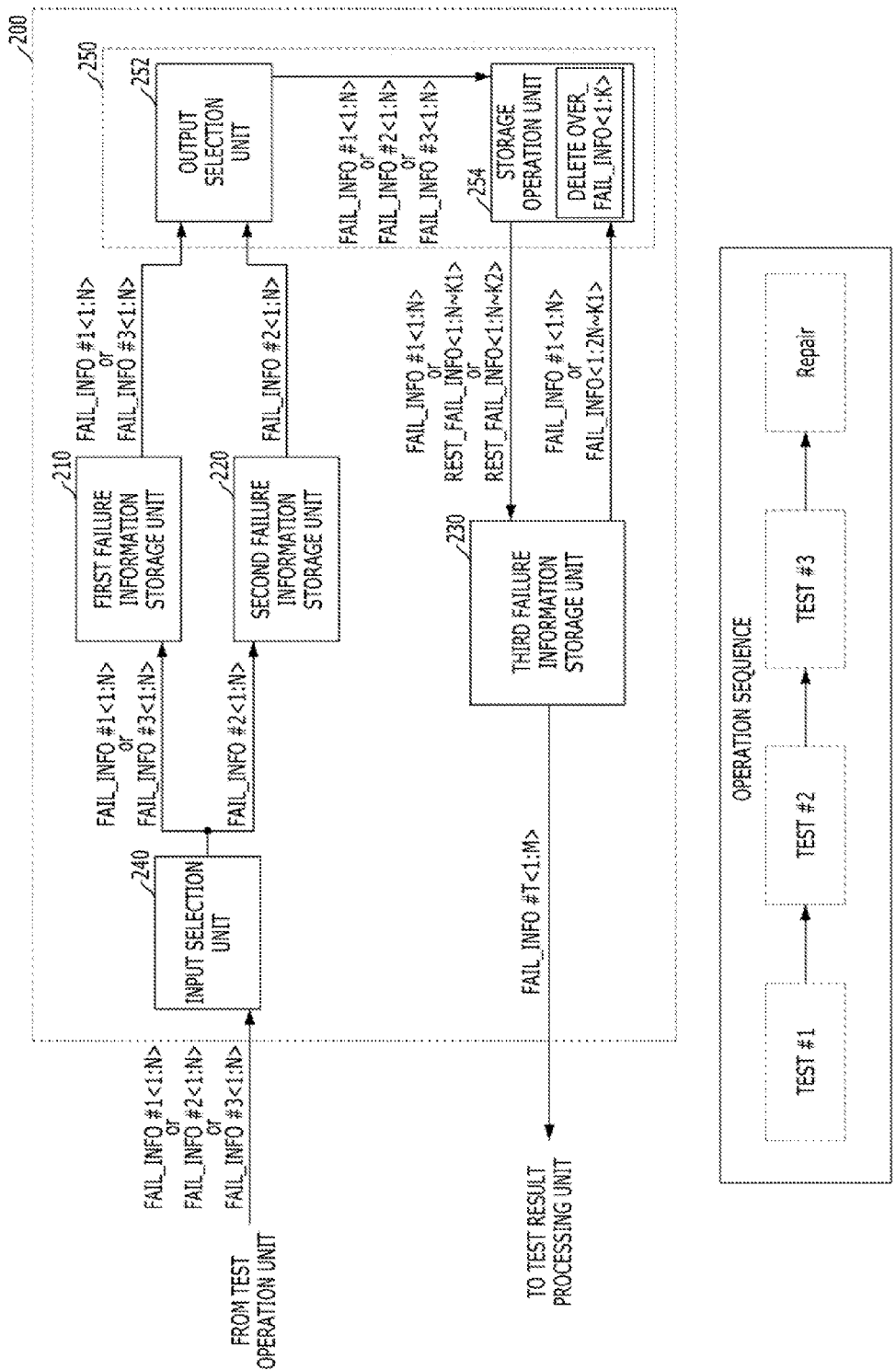

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, thicknesses and lengths of components are exaggerated compared to actual physical thickness and lengths for convenience of illustration. In the following description, a detailed explanation of known related functions and constitutions may be omitted to avoid unnecessarily obscuring the subject manner of the present invention. Furthermore, "connected/coupled" represents that one component is directly coupled to another component or indirectly coupled through another component. In this specification a singular form may include a plural form as long as it is not specifically mentioned in a sentence. Furthermore, "include/comprise" or "including/comprising" used in the specification represents that one or more components, steps, operations, and elements exist or are added.

FIGS. 2A to 2E are diagrams illustrating an integrated circuit 200 in accordance with a first embodiment of the present invention.

Referring to FIG. 2A, the integrated circuit 200 may include a first failure information storage unit 210, a second failure information storage unit 220, a third failure information storage unit 230, an input selection unit 240, and a storage selection unit 250.

The integrated circuit 200 may support a test operation. The integrated circuit 200 may be implemented in one chip or multiple chips or may be implemented on a board or a module. The integrated circuit 200 may be attached in a tester or in test equipment, on which a semiconductor device to be tested is mounted, that is, a device under test (DUT), or may be separately provided outside the tester. Additionally, a test operation unit and a test result processing unit as shown in FIG. 2A, may be included in the tester.

The storage selection unit 250 may include an output selection unit 252 and a storage operation unit 254.

The first failure information storage unit 210 may include a plurality of latches or flip-flops (not illustrated) to store plural pieces of failure information FAIL_INFO#1<1:N> or FAIL_INFO#3<1:N>. The number of pieces of failure information FAIL_INFO#1<1:N> or FAIL_INFO#3<1:N> stored in the first failure information storage unit 210 may be designed to store the maximum number of pieces of failure information which are expected to be generated at one test TEST#1 or #3.

The second failure information storage unit 220 may include a plurality of latches or flip-flops (not illustrated) to store plural pieces of failure information FAIL_INFO#2<1:N>. The number of pieces of failure information FAIL_INFO#2<1:N> stored in the second failure information storage unit 220 may be designed to store the maximum number of pieces of failure information, which are expected to be generated at one test TEST#2.

That is, the first failure information storage unit 210 and the second failure information storage unit 220 are coupled in parallel to the input selection unit 240, and designed in the same manner as each other.

For reference, among the plurality of tests TEST#1, TEST#2, and TEST#3, the first test TEST#1 is performed to generate plural pieces of first failure information FAIL_INFO#1<1:N>, the second test TEST#2 is performed to generate plural pieces of second failure information FAIL_INFO#2<1:N>, and the third test TEST#3 is performed to generate plural pieces of third failure information FAIL_INFO#3<1:N>. FIG. 2A illustrates the configuration in which the plural pieces of first or third failure information FAIL_INFO#1<1:N> or FAIL_INFO#3<1:N> are stored in the first failure information storage unit 210 and the plural pieces of second failure information FAIL_INFO#2<1:N> are stored in the second failure information storage unit 220. This configuration is based on the operation of the input selection unit 240, which will be described below.

The third failure information storage unit 230 may include a plurality of latches or flip-flops (not illustrated) to store plural pieces of failure information FAIL_INFO#T<1:M>. The third failure information storage unit 230 may be designed to store the maximum number of pieces of failure information which are expected to be generated without overlapping each other during the plurality of tests TEST#1, TEST#2, and TEST#3.

That is, the plural pieces of failure information FAIL_INFO#T<1:M> stored in the third failure information storage unit 230 may indicate failure information obtained by combining the plural pieces of first failure information FAIL_INFO#1<1:N>, the plural pieces of second failure information FAIL_INFO#2<1:N>, and the plural pieces of third failure information FAIL_INFO#3<1:N> while overlapping failure information is included only one time.

Thus, the number of pieces of failure information FAIL_INFO#T<1:M> stored in the third failure information storage unit 230 may be designed to be different from the number of pieces of failure information FAIL_INFO#1<1:N>, FAIL_INFO#2<1:N>, or FAIL_INFO#3<1:N> stored in the first or second failure information storage unit 210 or 220. For example, when the number of pieces of failure information FAIL_INFO#T<1:M> stored in the third failure information storage unit 230 is set to M the number of pieces of failure information FAIL_INFO#1<1:N> or FAIL_INFO#2<1:N> stored in the first or second failure information storage unit 210 or 220 may be set to N. In this case, M is a natural number larger than N.

For reference, the plural pieces of failure information FAIL_INFO#1<1:N>, FAIL_INFO#2<1:N>, or FAIL_INFO#3<1:N>, which may be stored in the first and second failure information storage units 210 and 220, will be referred to as N pieces of failure information FAIL_INFO#1<1:N>, FAIL_INFO#2<1:N>, or FAIL_INFO#3<1:N>, and the plural pieces of failure information FAIL_INFO#T<1:M> stored in the third failure information storage unit 230 will be referred to as M pieces of failure information FAIL_INFO#T<1:M>.

The test operation unit performs the plurality of test TEST#1, TEST#2, and TEST#3 in a preset order on a DUT, and outputs N pieces of failure information FAIL_INFO#1<1:N>, FAIL_INFO#2<1:N>, or FAIL_INFO#3<1:N>, generated whenever each of the tests TEST#1 TEST#2, and TEST#3 is performed on the DUT, to the input selection unit 240. Since the plurality of tests TEST#1, TEST#2, and TEST#3 may not be performed at the same time, N pieces of first failure information FAIL_INFO#1<1:N>, N pieces of second failure information FAIL_INFO#2<1:N>, and N pieces of third failure information FAIL_INFO#3<1:N> may be inputted to the input selection unit 240 at different time points.

Figure 2B:
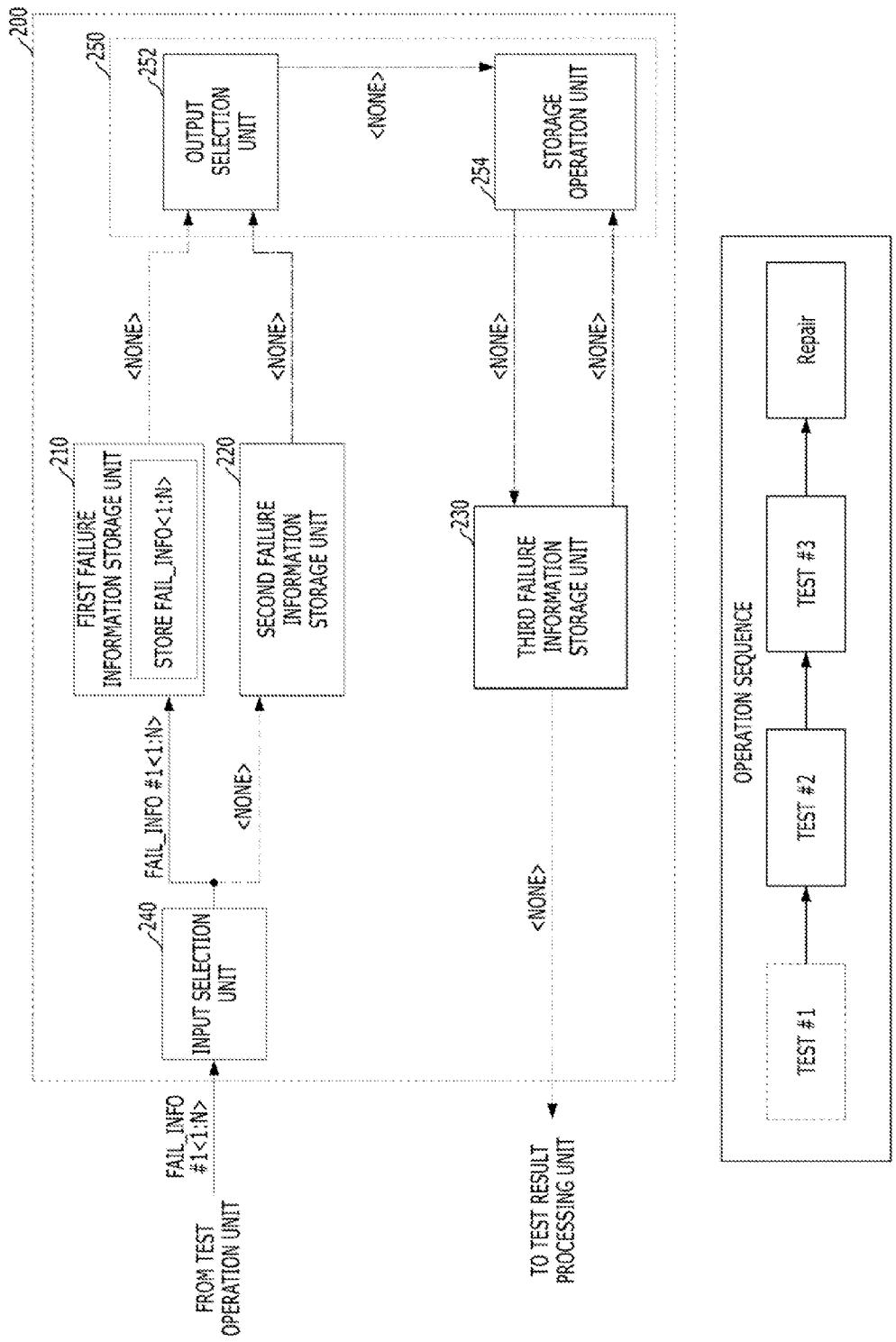
Figure 2C:
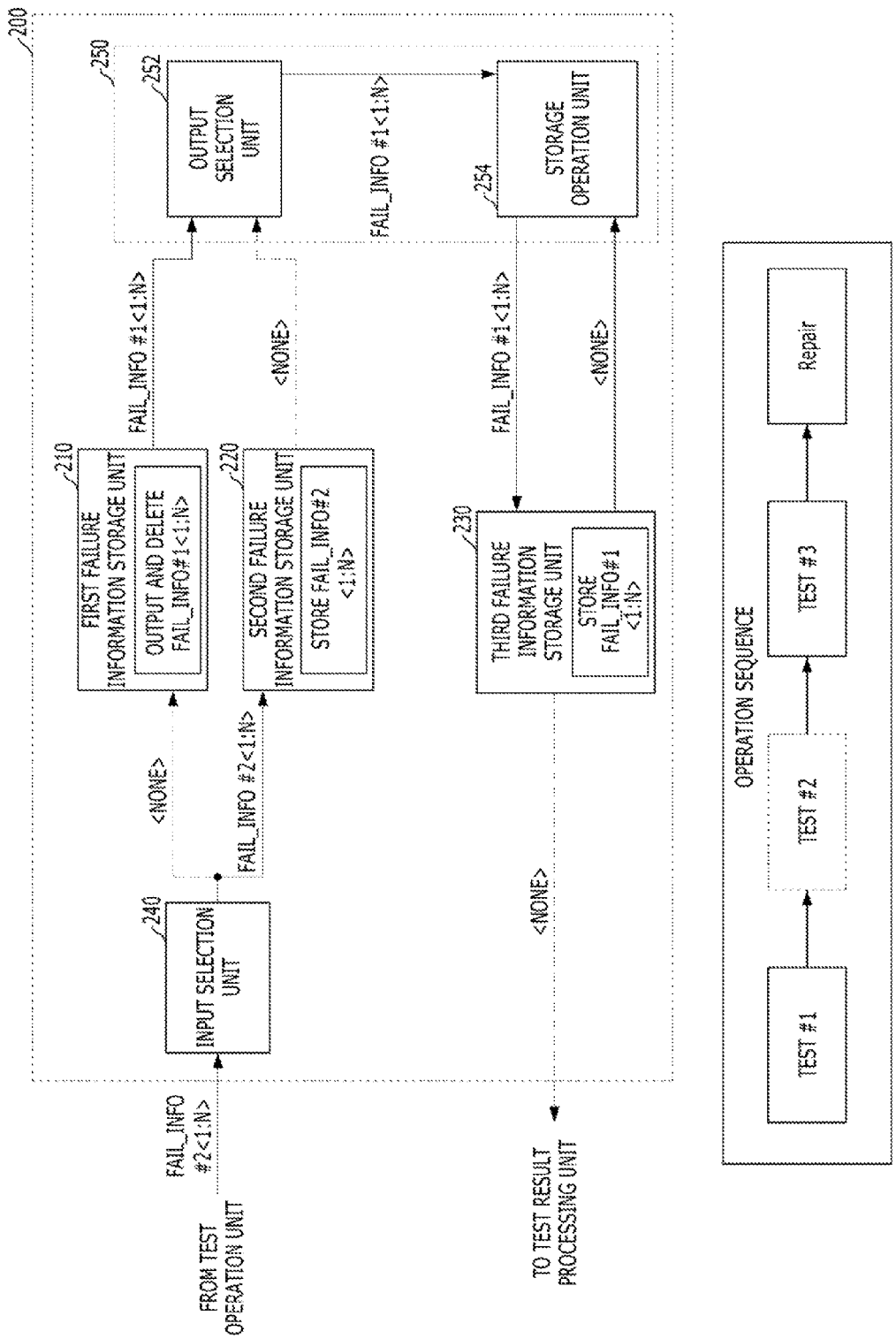

For example, as illustrated in FIG. 2B, the test operation unit may perform the first test TEST#1 to generate N pieces of first failure information FAIL_INFO#1<1:N>, and then output the N pieces of first failure information FAIL_INFO#1<1:N> to the input selection unit 240. Furthermore, as illustrated in FIG. 2C, the test operation unit may perform the second test TEST#2 to generate N pieces of second failure information FAIL_INFO#2<1:N>, and then output the N pieces of second failure information FAIL_INFO#2<1:N> to the input selection unit 240. Furthermore, as illustrated in FIG. 2D, the test operation unit may perform the third test TEST#3 to generate N pieces of third failure information FAIL_INFO#3<1:N>, and then output the N pieces of third failure information FAIL_INFO#3<1:N> to the input selection unit 240.

The input selection unit 240 alternately stores the N pieces of failure information FAIL_INFO#1<1:N>, FAIL_INFO#2<N>, or FAIL_INFO#3<1:N>, generated whenever each of the tests TEST#1, TEST#2, and TEST#3 is performed in the first and second failure information storage units 210 and 220.

For example, as illustrated in FIG. 2B, the input selection unit 240 may store the N pieces of first failure information FAIL_INFO 1<1:N>, generated as the result of the first test TEST#1 performed through the test operation unit, in the first failure information storage unit 210. Then, as illustrated in FIG. 2C, the input selection unit 240 may store the N pieces of second failure information FAIL_INFO#2<1:N>, generated as the result of the second test TEST#2 performed through the test operation unit, in the second failure information storage unit 220. Furthermore, as illustrated in FIG. 2D, the input selection unit 240 may store the N pieces of third failure information FAIL_INFO#3<1:N>, generated as the result of the third test TEST#3 performed through the test operation unit, in the first failure information storage unit 210.

The storage selection unit 250 selects the first or second failure information storage unit 210 or 220 in the opposite manner to selection of the input selection unit 240, whenever each of the tests TEST#1, TEST#2, and TEST#3 is performed. Then, the storage selection unit 250 transfers the N pieces of failure information FAIL_INFO#1<1:N>, FAIL_INFO#2<1:N>, or FAIL_INFO#3<1:N>, stored in the selected failure information storage unit 210 or 220, into the third failure information storage unit 230. The storage selection unit 250 stores overlapping failure information OVER_FAIL_INFO<1:K> only one time. That is, the storage selection unit 250 additionally stores or relocates, only rest failure information REST_FAIL_INFO<1:N-K1> or REST_FAIL_INFO<1:N-K2> in the third failure information storage unit 230, and then initializes the selected failure information storage unit 210 or 220. The rest failure information REST_FAIL_INFO<1:N-K1> or REST_FAIL_INFO<1:N-K2> may be obtained by excluding the overlapping failure information OVER_FAIL_INFO<1:K>, which overlaps the M pieces of failure information FAIL_INFO#T<1:M> stored in the third failure information storage unit 230, from the N pieces of failure information FAIL_INFO#1<1:N>, FAIL_INFO#2<1:N>, or FAIL_INFO#1:N> stored in the selected failure information storage unit 210 or 220 whenever each of the tests TEST#1, TEST#2, and TEST#3 is performed.

The output selection unit 252 selects the first or second failure information storage unit 210 or 220 in the opposite manner to selection of the input selection unit 240, whenever each of the tests TEST#1, TEST#2, and TEST#3 is performed. At a preset period after all of the tests TEST#1, TEST#2, and TEST#3 are performed, the output selection unit 252 additionally selects the failure information storage unit 210 or 220, which was selected by the input selection unit 240 when the last test TEST#3 was performed.

The storage operation unit 254 compares the N pieces of failure information FAIL_INFO#1<1:N>, FAIL_INFO#2<1:N>, or FAIL, INFO#3<1:N>, stored in the failure information storage units 210 or 220 selected by the output selection unit 252, to the M pieces of failure information FAIL_INFO#T<1:M> stored in the third failure information storage unit 230, and additionally stores the rest failure information REST_FAIL_INFO<1:N-K1> or REST_FAIL_INFO<1:N-K2>, obtained by excluding the overlapping failure information OVER_FAIL_INFO<1:K> according to the comparison result, in the third failure information storage unit 230.

For example, the input selection unit 240 stores N pieces of failure information FAIL_INFO#1<1:N> or FAIL_INFO#3<1:N>, generated whenever an odd-numbered test TEST#1 or TEST#3 among the plurality of tests TEST#1, TEST#2, and TEST#3 is performed, in the first failure information storage unit 210. The input selection unit 240 stores N pieces of failure information FAIL_INFO#2<1:N>, generated whenever an even-numbered test TEST#2 among the plurality of tests TEST#1, TEST#2, and TEST#3 is performed, in the second failure information storage unit 220.

Figure 2E:
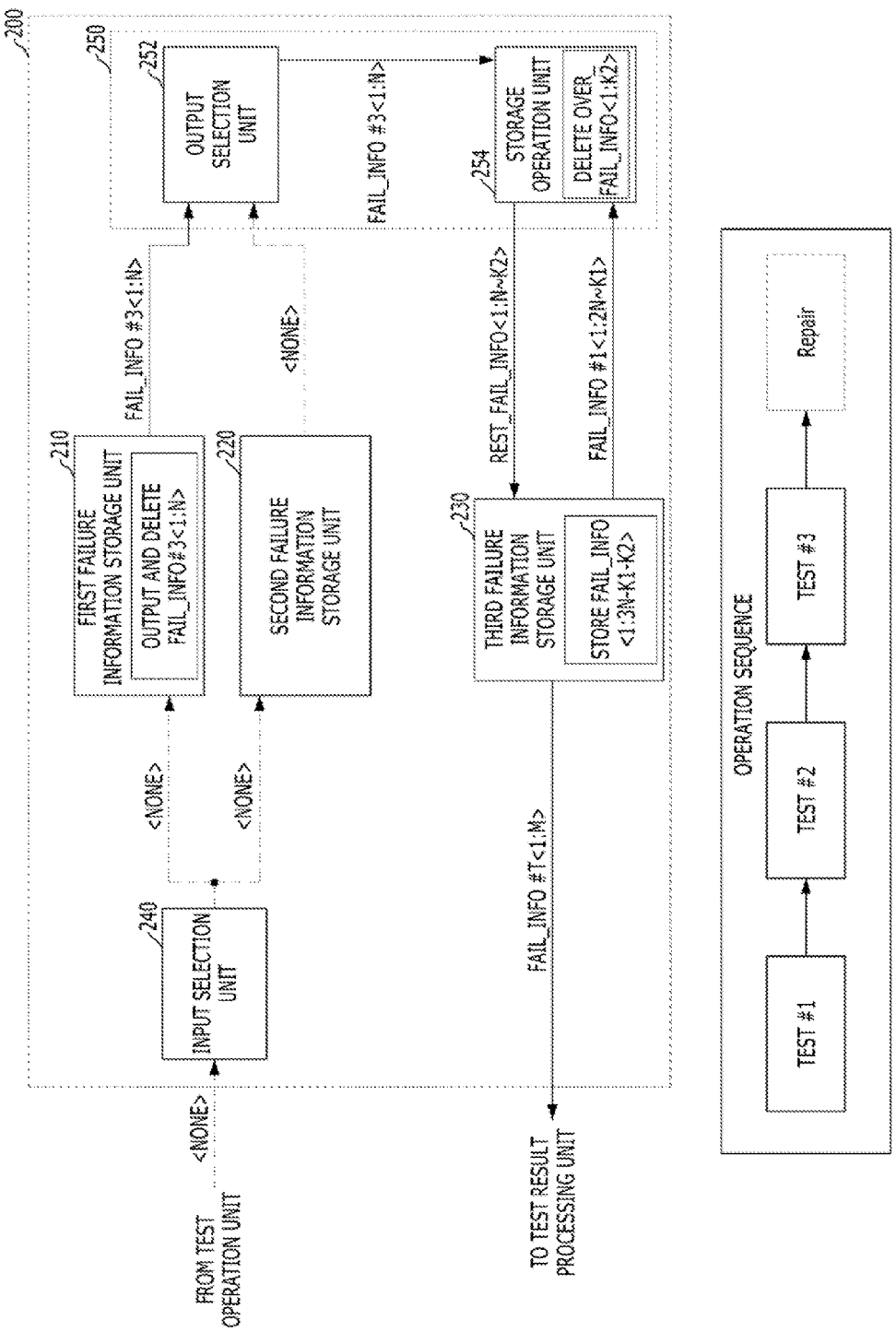

Whenever an even-numbered test TEST#2 among the plurality of tests TEST#1, TEST#2, and TEST#3 is performed, the output selection unit 252 couples an output terminal of the first failure information storage unit 210 to the storage operation unit 254 and does not couple an output terminal of the second failure information storage unit 220 to the storage operation unit 254. Furthermore, whenever an odd-numbered test TEST#1 or TEST#3 among the plurality of tests TEST#1, TEST#2, and TEST#3 is performed, the output selection unit 252 couples the output terminal of the second failure information storage unit 220 to the storage operation unit 254 and does not couple the output terminal of the first failure information storage unit 210 to the storage operation unit 254. Furthermore, when the last test TEST#3 among the plurality of tests TEST#1, TEST#2, and TEST#3 is an odd-numbered test as illustrated in FIG. 2E, the output selection unit 252 couples the output terminal of the first failure information storage unit 210 to the storage operation unit 254 and does not couple the output terminal of the second failure information storage unit 220 to the storage operation unit 254, at a preset period after all of the test. TEST#1, TEST#2, and TEST#3 are performed. Furthermore, when the last test. TEST#3 among the plurality of tests TEST#1, TEST#2, and TEST#3 is an even-numbered test unlike the state illustrated in FIG. 2E, the output selection unit 252 couples the output terminal of the second failure information storage unit 210 to the storage operation unit 254 and does not couple the output terminal of the first failure information storage unit 210 to the storage operation unit 254, at a preset period after all of the test TEST#1, TEST#2, and TEST#3 are performed.

When the storage operation unit 254 is coupled to the output terminal of the first failure information storage unit 210 through the operation of the output selection unit 252, the storage operation unit 254 compares the N pieces of failure information FAIL_INFO#1<1:N> or FAIL_INFO#3<1:N> stored in the first failure information storage unit 210 to the M pieces of failure information FAIL_INFO#T<1:M> stored in the third failure information storage unit 230, selects only the rest failure information REST_FAIL_INFO<1:N-K1> or REST_FAIL_INFO<1:N-K2>, which does not overlap the M pieces of failure information FAIL_INFO#T<1:M>, with the N pieces of failure information FAIL_INFO#1<1:N> or FAIL_INFO#3<1:N> stored in the first failure information storage unit 210, and stores the selected information in the third failure information storage unit 230. Then, the storage operation unit 254 deletes all of the N pieces of failure information FAIL_INFO#1<1:N> or FAIL_INFO#3<1:N> stored in the first failure information storage unit 210. Furthermore, when the storage operation unit 254 is coupled to the output terminal of the second failure information storage unit 220 through the operation of the output selection unit 252, the storage operation unit 254 compares the N pieces of failure information FAIL_INFO#2<1:N> stored in the second failure information storage unit 220 to the M pieces of failure information FAIL_INFO#T<1:M> stored in the third failure information storage unit 230, selects only the rest failure information REST_FAIL_INFO<1:N-K1> or REST_FAIL_INFO<1:N-K2>, which does not overlap the M pieces of failure information FAIL_INFO#T<1:M>, with the N pieces of failure information FAIL_INFO#2<1:N> stored in the second failure information storage unit 220, and stores the selected information in the third failure information storage unit 230. Then, the storage operation unit 254 deletes all of the N pieces of failure information FAIL_INFO#2<1:N> stored in the second failure information storage unit 220.

For reference, since the first embodiment of the present invention is based on the supposition that the number of tests TEST#1, TEST#2, and TEST#3 is set to three, the number of odd-numbered tests TEST#1 and TEST#3 is two and the number of even-numbered test TEST#2 is one. However, this is only an example, and a larger number of tests may be sequentially performed, first to third failure information storage units 210, 220, and 230, the input selection unit 240, and the storage selection unit 250 will now be described.

As illustrated in FIG. 2B, when the input selection unit 240 selects the first failure information storage unit 210 while the first test TEST#1 is performed, the output selection unit 252 selects the second failure information storage unit 220. However, no failure information is stored in the second failure information storage unit 220 while the first test TEST#1 is performed. Thus, the storage operation unit 254 performs no operation, and no failure information is stored in the third failure information storage unit 230.

As illustrated in FIG. 2C, when the input selection unit 240 selects the second failure information storage unit 220 while the second test TEST#2 is performed, the output selection unit 252 selects the first failure information storage unit 210. While the second test TEST#2 is performed as illustrated in FIG. 2C, the N pieces of failure information FAIL_INFO#1<1:N>, generated when the first test TEST#1 was performed as illustrated in FIG. 2B, are already stored in the first failure information storage unit 210. Thus, while the second test TEST#2 is performed as illustrated in FIG. 2C, the storage operation unit 254 transfers the N pieces of failure information FAIL. INFO#1<1:N>, generated when the first test TEST#1 was performed as illustrated in FIG. 2B, into the third failure information storage unit 230 from the first failure information storage unit 210. At this time, no failure information is stored in the third failure information storage unit 230 while the second test TEST#2 is performed as illustrated in FIG. 2C. Thus, the storage operation unit 254 stores the N pieces of failure information FAIL_INFO#1<1:N>, generated as the result of the first test TEST#1, in the third failure information storage unit 230 as it is. Therefore, M pieces of failure information FAIL_INFO#T<1:M>, stored in the third failure information storage unit 230 when the second test TEST#2 is ended, may be considered as the N pieces of failure information FAIL_INFO#1<1:N> generated as the result of the first test TEST#1.

When the input selection unit 240 reselects the first failure information storage unit 210 while the third test TEST#3 is performed as illustrated in FIG. 2D, the output selection unit 252 reselects the second failure information storage unit 220. While the third test TEST3# is performed as illustrated in FIG. 2D, the N pieces of failure information FAIL_INFO#2<1:N>, generated when the second test. TEST#2 was performed as illustrated in FIG. 2C, are already stored in the second failure information storage unit 220. Thus, while the third test. TEST3# is performed as illustrated in FIG. 2D, the storage operation unit 254 transfers the N pieces of failure information FAIL_INFO#2<1:N>, generated when the second test TEST#2 was performed as illustrated in FIG. 2C, into the third failure information storage unit 230 from the second failure information storage unit 220. While the third test TEST3# is performed as illustrated in FIG. 2D, the N pieces of failure information FAIL_INFO#1<1:N>, generated when the first test TEST#1 was performed, are already stored in the third failure information storage unit 230. Thus, while the third test TEST3# is performed as illustrated in FIG. 2D, the storage operation unit 254 compares the N pieces of failure information FAIL_INFO#2<1:N> generated as the result of the second test TEST#2 to the N pieces of failure information FAIL_INFO#1<1:N> generated as the result of the first test TEST#1, determines first rest failure information REST_FAIL_INFO<1:N-K1> by excluding the first overlapping failure information OVER_FAIL_INFO<1:K1> from the N pieces of failure information FAIL_INFO#2<1:N> generated as the result of the second test TEST#2, and then additionally stores the first rest failure information REST_FAIL_INFO<1:N-K1> in the third failure information storage unit 230. As a result, first overlap-removed failure information FAIL_INFO<1:2N-K1> is stored in the third failure information storage unit 230 when the third test TEST#3 illustrated in FIG. 2D is ended. The first overlap-removed failure information FAIL_INFO<1:2N-K1> is obtained by combining the first rest failure information REST_FAIL_INFO<1:N-K1> and the N pieces of failure information FAIL_INFO#1<1:N> generated as the result of the first test TEST#1. Thus, when the third test TEST#3 is ended, the M pieces of failure information FAIL_INFO#T<1:M> stored in the third failure information storage unit 230 may be considered as the first overlap-removed failure information FAIL_INFO<1:2N-K1>.

As illustrated in FIG. 2E, when the input selection unit 240 performs no operation since all of the tests TEST#1, TEST#2, and TEST#3 were performed, the output selection unit 252 additionally selects the first failure information storage unit 220. The N pieces of failure information FAIL_INFO#3<1:N> generated when the third test TEST#3 was performed as illustrated in FIG. 2D are already stored in the first failure information storage unit 210 at the preset period after all of the tests TEST#1, TEST#2, and TEST#3 are performed as illustrated in FIG. 2E. Thus, during the preset period after all of the tests TEST#1, TEST#2, and TEST#3 are performed as illustrated in FIG. 2E, the storage operation unit 254 transfers the N pieces of failure information FAIL_INFO#3<1:N>, generated when the third test TEST#3 was performed as illustrated in FIG. 2D, into the third failure information storage unit 230 from the first failure information storage unit 210. During the preset period after all of the tests TEST#1, TEST#2, and TEST#3 are performed as illustrated in FIG. 2E, the first overlap-removed failure information FAIL_INFO#1<1:2N-K1> is already stored in the third failure information storage unit 230. Thus, during the preset period after all of the tests TEST#1, TEST#2, and TEST#3 are performed as illustrated in FIG. 2E, the storage operation unit 254 compares the first overlap-removed failure information FAIL_INFO#1<1:2N-K1> to the N pieces of failure information FAIL_INFO#3<1:N> generated as the result of the third test TEST#3, determines second rest failure information REST_FAIL_INFO<1:N-K2> by excluding the second overlapping failure information OVER_FAIL_INFO<1:K2> from the N pieces of failure information FAIL_INFO#3<1:N> generated as the result of the third test TEST#3 according to the comparison result, and then additionally stores the second rest failure information REST_FAIL_INFO<1:N-K2> in the third failure information storage unit 230. As a result, when the preset period is ended after all of the tests TEST#1, TEST#2, and TEST#3 are performed as illustrated in FIG. 2E, second overlap-failure information FAIL_INFO<1:3N-K1-K2> is stored in the third failure information storage unit 230. The second overlap-failure information FAIL_INFO<1:3N-K1-K2> is obtained by combining the first rest failure information REST_FAIL_INFO<1:N-K1>, the second rest failure information REST_FAIL_INFO<1:N-K2>, and the N pieces of failure information FAIL_INFO#1<1:N> generated as the result of the first test TEST#1.

As illustrated in FIGS. 2B to 2E, the second overlap-failure information FAIL_INFO<1:3N-K1-K2> is finally stored in the second failure information storage unit 230, as the result of the plurality of tests TEST#1, TEST#2, and TEST#3. Thus, the M pieces of failure information FAIL_INFO#T<1:M>, which are finally stored in the third failure information storage unit 230, may be considered as the second overlap-removed failure information FAIL_INFO<1:3N-K1-K2>. The configuration illustrated in FIGS. 2B to 2E is only an example. When a larger number of tests are sequentially performed, M pieces of failure information FAIL_INFO#T<1:M> may be set in a different manner.

The test result processing unit repairs errors, which occurred in the DUT, using the M pieces of failure information FAIL_INFO#T<1:M> stored in the third failure information storage unit 230, after all of the tests TEST#1, TEST#2, and TEST#3 are performed. That is, the test result processing unit operates during a repair period that is performed after all of the tests TEST#1, TEST#2, and TEST#3 are performed. For example, when information containing failures, which occurred in a plurality of memory cells in a semiconductor memory device such as DDR DRAM, is stored in the third failure information storage unit 230, circuits for repairing the defective memory cells in the DUT with redundancy memory cells may be included in the test result processing unit.

For reference, during the preset period, which needs to be guaranteed for the operation illustrated in FIG. 2E after all of the tests TEST#1, TEST#2, and TEST#3 are performed, the repair period may be set so as not to overlap the preset period or set to overlap the preset period. For example, when the M pieces of failure information FAIL_INFO#T<1:M> stored in the third failure information storage unit 230 are transmitted to the test result processing unit, the preset period and the repair period may overlap each other when the M pieces of failure information FAIL_INFO#T<1:M> are sequentially transmitted from the previously stored failure information. Moreover, when the M pieces of failure information FAIL_INFO#T<1: > stored in the third failure information storage unit 230 are transmitted to the test result processing unit, the test result processing unit needs to enter the repair period after the preset period, when the M pieces of failure information FAIL_INFO#T<1:M> are transmitted in parallel. When the preset period and the repair period are set to not overlap each other, the test result processing unit may enter the repair period in a predetermined time after the preset time, as long as the condition that the repair period follows the preset period is maintained.

As described above, when the first embodiment of the present invention is applied to an integrated circuit, the plural pieces of failure information FAIL_INFO#1<1:N>, FAIL_INFO#2<1:N>, or FAIL_INFO#3<1:N> occurring in each of the tests TEST#1, TEST#2, and TEST#3 are alternately stored in the two different storage spaces, when the plurality of tests TEST#1, TEST#2, and TEST#3 are sequentially and intensely performed. Then, when the plural pieces of failure information FAIL_INFO#1<1:N>, FAIL_INFO#2<1:N>, or FAIL_INFO#3<1:N> stored in each of the two storage spaces 210 and 220 are transferred into the third storage space 230, the overlapping failure information OVER_FAIL_INFO<1:K> is removed. Thus, the overlapping failure information OVER_FAIL_INFO<1:K> is contained in the third storage space 230 only once. Therefore, when the plurality of tests TEST#1, TEST#2, and TEST#3 are performed, the space for storing the plural pieces of failure information FAIL_INFO#1<1:N>, FAIL_INFO#2>1:N>, and FAIL_INFO#3<1:N> may be minimized.

Figure 3B:
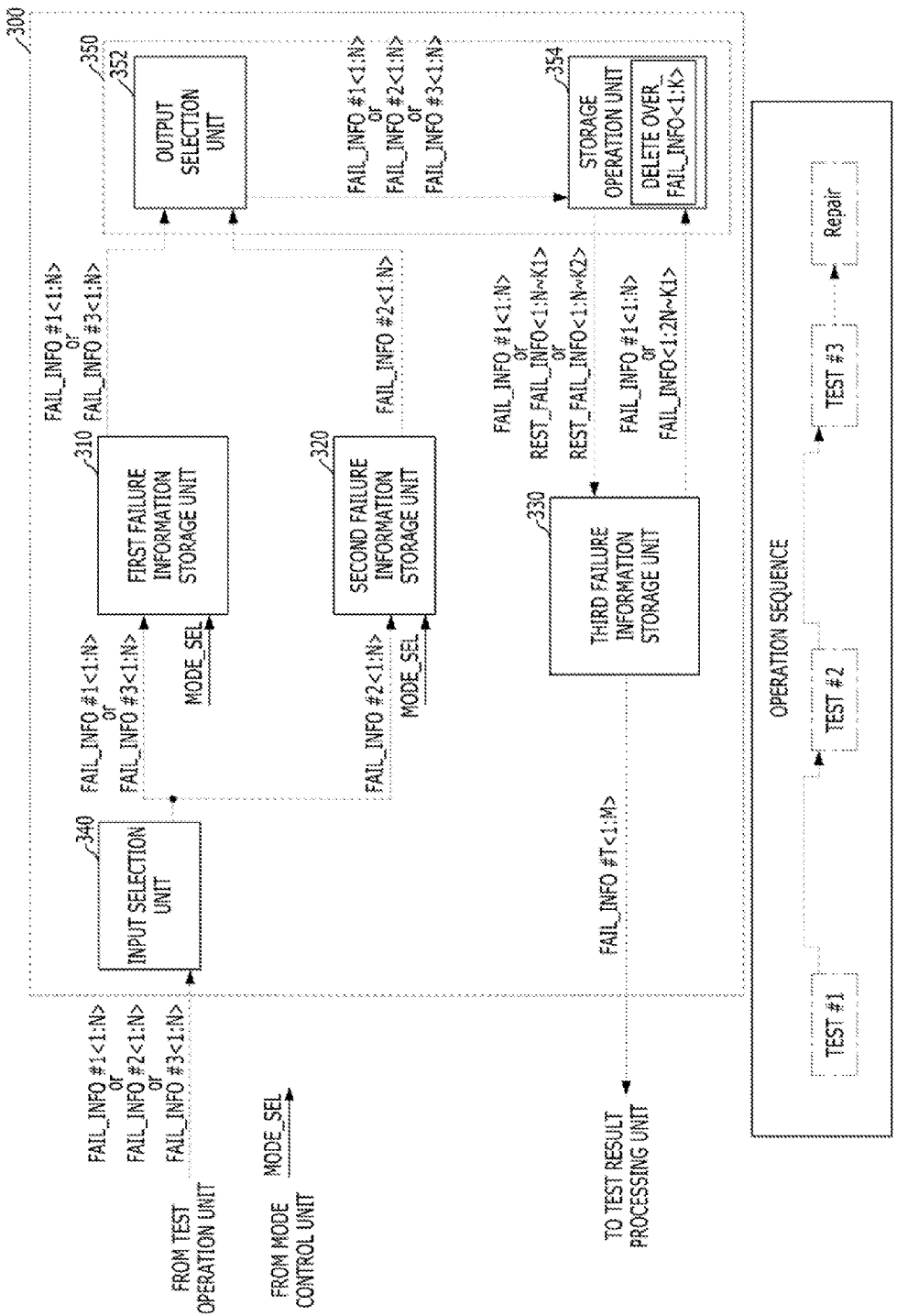

FIGS. 3A to 3C are diagrams illustrating an integrated circuit 300 in accordance with a second embodiment of the present invention.

Referring to FIG. 3A, the integrated circuit 300 may include a first failure information storage unit 310, a second failure information storage unit 320, a third failure information storage unit 330, an input selection unit 340, and a storage selection unit 350.

The integrated circuit 300 may support a test operation. The integrated circuit 300 may be implemented in one chip or multiple chips or may be implemented on a board or a module. The integrated circuit 300 may be attached in a tester or test equipment, on which a semiconductor device to be tested is mounted, that is, a device under test (DUT), or may be separately provided outside the tester. Additionally, a mode control unit, a test operation unit, and a test result processing unit shown in FIG. 2A may be included in the tester.

The storage selection unit 350 may include an output selection unit 352 and a storage operation unit 354.

The first failure information storage unit 310 may include a plurality of latches or flip-flops (not illustrated) to store plural pieces of failure information FAIL_INFO#1<1:N>, FAIL_INFO#2<1:N>, or FAIL_INFO#3<1:N>. The number of pieces of failure information FAIL_INFO#1<:N>, FAIL_INFO#2<1:N>, or FAIL_INFO#3<1:N> stored in the first failure information storage unit 310 may be designed to store the maximum number of pieces of failure information, which are expected to be generated during one test TEST#1, TEST#3, or TEST#3.

The second failure information storage unit 320 may include a plurality of latches or flip-flops (not illustrated) to store plural pieces of failure information FAIL_INFO#1<1:N>, FAIL_INFO#2<1:N>, or FAIL_INFO#3<1:N>. The number of pieces of failure information FAIL_INFO#1<1:N>, FAIL_INFO#2<1:N>, or FAIL_INFO#3<1:N> stored in the second failure information storage unit 320 may be designed to store the maximum number of pieces of failure information, which are expected to be generated during one test TEST#1, TEST#3, or TEST#3.

That is, the first failure information storage unit 310 and the second failure information storage unit 320 may be coupled in parallel to the input selection unit 340, and designed in the same manner as each other.

For reference, among the plurality of tests TEST#1, TEST#2, and TEST#3, the first test TEST#1 is performed to generate plural pieces of first failure information FAIL_INFO#1<1:N>, the second test TEST#2 is performed to generate plural pieces of second failure information FAIL_INFO#2<1:N>, and the third test TEST#3 is performed to generate plural pieces of third failure information FAIL_INFO#3<1:N>.

The third failure information storage unit 330 may include a plurality of latches or flip-flops (not illustrated) to store plural pieces of failure information FAIL_INFO#T<1:M>. The number of pieces of failure information stored in the third failure information storage unit 330 may be designed to store the maximum number of pieces of failure information, which are expected to be generated without overlapping each other, during the plurality of tests TEST#1, TEST#2, and TEST#3.

That is, the plural pieces of failure information FAIL_INFO#T<1:M> stored in the third failure information storage unit 230 may indicate failure information obtained by combining the plural pieces of first failure information FAIL_INFO#1<1:N>, the plural pieces of second failure information FAIL_INFO#2<1:N>, and the plural pieces of third failure information FAIL_INFO#3<1:N> while overlapping failure information is included only once.

Thus, the number of pieces of failure information FAIL_INFO#T<1:M> stored in the third failure information storage unit 330 may be designed to be different from the number of pieces of failure information FAIL_INFO#1<1:N>, FAIL_INFO#2<1:N>, or FAIL_INFO#3<1:N> stored in the first or second failure information storage unit 310 or 320. For example, when the number of pieces of failure information FAIL_INFO#T<1:M> stored in the third failure information storage unit 330 is set to M, the number of pieces of failure information FAIL_INFO#1<1:N>, FAIL_INFO#2<1:N>, or FAIL_INFO#3<1:N> stored in the first or second failure information storage unit 310 or 320 may be set to N, where, M is a natural number larger than N.

For reference, to clarify a difference therebetween, the plural pieces of failure information FAIL_INFO#1<1:N>, FAIL_INFO#2<1:N>, or FAIL_INFO#3<1:N>, which may be stored in the first and second failure information storage units 310 and 320, will be referred to as N pieces of failure information FAIL_INFO#1<1:N>, FAIL_INFO#2<1:N>, or FAIL_INFO#3<1:N>, and the plural pieces of failure information FAIL_INFO#T<1:M> stored in the third failure information storage unit 330 will be referred to as M pieces of failure information FAIL_INFO#T<1:M>.

The test operation unit performs the plurality of tests TEST#1, TEST#2, and TEST#3 on a DUT in a preset order, and outputs N pieces of failure information FAIL_INFO#1<1:N>, FAIL_INFO#2<1:N>, or FAIL_INFO#3<1:N> to the input selection unit 340, generated whenever each of the tests TEST#1 TEST#2, and TEST#3 is performed on the DUT. Since the plurality of tests TEST#1, TEST#2, and TEST#3 may not be performed at the same time, the N pieces of first failure information FAIL_INFO#1<1:N>, the N pieces of second failure information FAIL_INFO#2<1:N>, and the N pieces of third failure information FAIL_INFO#3<1:N> are inputted to the input selection unit 340 at different time points.

The mode control unit generates a mode control signal MODE_SEL for distinguishing between first and second operation modes, and transmits the generated mode control signal MODE_SEL to the first and second failure information storage units 310 and 320. For example, the mode control unit does not couple the first and second failure information storage units 310 and 320 such that the first operation mode is performed based on the mode control signal MODE_SEL having a first logic level such as, a logic high level. The mode control unit couples the first and second failure information storage units 310 and 320 such that the second operation mode is performed based on the operation mode signal MODE_SEL having a second logic level such as, a logic low level. Then, the first and second failure information storage units 310 and 320 coupled to each other are set to an integrated failure information storage unit.

During the second operation mode set by the mode control unit, a test may be normally performed even when the N pieces of failure information FAIL_INFO#1<1:N>, FAIL_INFO#2<1:N>, or FAIL_INFO#3<1:N>, generated whenever each of the tests TEST#1, TEST#2, and TEST#3 is performed, exceed the maximum number of pieces of failure information, which are expected to be generated during one test TEST#1, TEST#2, or TEST#3. Since the integrated failure information storage unit is configured by coupling the first and second failure information storage units 310 and 320, the capacity is doubled. That is, the test may be normally performed until the N pieces of failure information FAIL_INFO#1<1:N>, FAIL_INFO#2<1:N>, or FAIL_INFO#3<1:N> exceed double of the maximum number of pieces of failure information, which are expected to be generated during one test TEST#1, TEST#2, or TEST#3.

During the second operation mode set by the mode control unit, the first and second failure information storage units 310 and 320 are coupled to operate as an integrated failure information storage unit. Thus, as described below, operations of the input selection unit 340 and the output selection unit 352 relay not be required.

The input selection unit 340 alternately stores the N pieces of failure information FAIL_INFO#1<1:N>, FAIL_INFO#2<1:N>, or FAIL_INFO#3<1:N>, generated whenever each of the tests TEST#1, TEST#2, and TEST#3 is performed, in the first failure information storage unit 310 and the second failure information storage unit 320 during the first operation mode.

In the second operation mode set by the mode control unit, when an output terminal of the first failure information storage unit 310 and an input terminal of the second failure information storage unit 320 are coupled to each other such that the first and second failure information storage units 310 and 320 are set to an integrated failure information storage unit as illustrated in FIG. 3A, or an output terminal of the second failure information storage unit 320 and an input terminal of the first failure information storage unit 310 are coupled to each other such that the first and second failure information storage units 310 and 320 are set to the integrated failure information storage unit, the input selection unit 340 stores the N pieces of failure information FAIL_INFO#1<1:N>, FAIL_INFO#2<1:N>, or FAIL_INFO#3<1:N> in the integrated failure information storage unit, that are generated whenever each of the tests TEST#1, TEST#2, and TEST#3 is performed.

The storage selection unit 350 selects the first or second failure information storage unit 310 or 320 in the opposite manner to the selection of the input selection unit 340, whenever each of the tests TEST#1, TEST#2, and TEST#3 is performed during the first operation mode. Then, the storage selection unit 350 transfers the N pieces of failure information FAIL_INFO#1<1:N>, FAIL_INFO#2<1:N>, or FAIL_INFO#3<1:N>, stored in the selected failure information storage unit 310 or 320, into the third failure information storage unit 330. The storage selection unit 250 stores overlapping failure information OVER_FAIL_INFO<1:K> only once. That is, the storage selection unit 350 additionally stores or relocates, only rest failure information REST_

FAIL_INFO<1:N-K1> or REST_FAIL_INFO<1:N-K2> in the third failure information storage unit 230 during the first operation mode, and then initializes the selected failure information storage unit 310 or 320. The rest failure information REST_FAIL_INFO<1:N-K1> or REST_FAIL_INFO<1:N-K2> may be obtained by excluding the overlapping failure information OVER_FAIL_INFO<1:K>, which overlaps the M pieces of failure information FAIL_INFO#T<1:M> stored in the third failure information storage unit 330, from the N pieces of failure information FAIL_INFO#1<1:N>, FAIL_INFO#2<1:N>, or FAIL_INFO#3<1:N> stored in the selected failure information storage unit 310 or 320, whenever each of the tests TEST#1, TEST#2, and TEST#3 is performed.

Furthermore, the storage selection unit 350 additionally stores only rest failure information REST_FAIL_INFO<1:N-K1> or REST_FAIL_INFO<1:N-K2> in the third failure information storage unit 330 in the second operation, and then initializes the integrated failure information storage unit. The rest failure information REST_FAIL_INFO<1:N-K1> or REST_FAIL_INFO<1:N-K2> may be obtained by excluding the overlapping failure information OVER_FAIL_INFO<1:K>, which overlaps the M pieces of failure information FAIL_INFO#T<1:M> stored in the third failure information storage unit 330, from the N pieces of failure information FAIL_INFO#1<1:N>, FAIL_INFO#2<1:N>, or FAIL_INFO#3<1:N> stored in the integrated failure information storage unit.

The output selection unit 352 selects the first or second failure information storage unit 310 or 320 in the opposite manner to the selection of the input selection unit 340, whenever each of the tests TEST#1, TEST#2, and TEST#3 is performed during the first operation mode. At a preset period, after all of the tests TEST#1, TEST#2, and TEST#3 are performed, the output selection unit 352 additionally selects the failure information storage unit 310 or 320, which was selected between the first and second failure information storage units 310 and 320 by the input selection unit 340 when the last test TEST#3 was performed.

Furthermore, the output selection unit 352 selects the integrated failure information storage unit whenever each of the of the tests TEST#1, TEST#2, and TEST#3 is performed during the second operation mode.

The storage operation unit 354 compares the N pieces of failure information FAIL_INFO#1<1:N>, FAIL_INFO#2<1:N>, or FAIL_INFO#3<1:N>, stored in the failure information storage unit 310, 320, or the integrated failure information storage unit 310 and 320, selected by the output selection unit 352, to the M pieces of failure information FAIL_INFO#T<1:M> stored in the third failure information storage unit 330, and additionally stores rest failure information REST_FAIL_INFO<1:N-K1> or REST_FAIL_INFO<1:N-K2>, obtained by excluding the overlapping failure information OVER_FAIL_INFO<1:K> according to the comparison result, the third failure information storage unit 330.

For example, during the first operation mode, the input selection unit 340 stores N pieces of failure information FAIL_INFO#1<1:N> or FAIL_INFO#3<1:N, generated whenever an odd-numbered test TEST#1 or TEST#3 among the plurality of tests TEST#1, TEST#2, and TEST#3 is performed, in the first failure information storage unit 310. The input selection unit 240 stores N pieces of failure information FAIL_INFO#2<1:N>, generated whenever an even-numbered test TEST#2 among the plurality of tests TEST#1, TEST#2, and TEST#3 is performed, in the second failure information storage unit 320.

Furthermore, during the second operation mode, the input selection unit 340 stores N pieces of failure information FAIL_INFO#1<1:N>, FAIL_INFO#2<1:N>, or FAIL_INFO#3<1:N>, generated whenever each of the tests TEST#1, TEST#2, and TEST#3 is performed, in the integrated failure information storage unit.

The output selection unit 352 couples an output terminal of the first failure information storage unit 310 to the storage operation unit 354 and does not couple an output terminal of the second failure information storage unit 320 to the storage operation unit 354, whenever an even-numbered test TEST#2 among the plurality of tests. TEST#1, TEST#2, and TEST#3 is performed during the first operation mode. Furthermore, the output selection unit 352 couples the output terminal of the second failure information storage unit 320 to the storage operation unit 354 and does not couple the output terminal of the first failure information storage unit 310 to the storage operation unit 354, whenever an odd-numbered test TEST#1 or TEST#3 among the plurality of tests TEST#1, TEST#2, and TEST#3 is performed during the first operation mode. Furthermore, when the last test TEST#3 among the plurality of tests TEST#1, TEST#2, and TEST#3 is an odd-numbered test in the first operation mode, the output selection unit 352 couples the output terminal of the first failure information storage unit 310 to the storage operation unit 354 and does not couple the output terminal of the second failure information storage unit 320 to the storage operation unit 354, at a preset period after all of the test TEST#1, TEST#2, and TEST#3 are performed. Furthermore, when the last test TEST#3 among the plurality of tests TEST#1, TEST#2, and TEST#3 is an even-numbered test in the first operation mode, the output selection unit 352 couples the output terminal of the second failure information storage unit 320 to the storage operation unit 354 and does not couple the output terminal of the first failure information storage unit 310 to the storage operation unit 354, at the preset period after all of the test TEST#1, TEST#2, and TEST#3 are performed.

Furthermore, the output selection unit 352 couples an output terminal of the integrated failure information storage unit 310 and 320 to the storage operation unit 354, whenever each of the tests TEST#1, TEST#2, and TEST#3 is performed or at the preset period after all of the tests TEST#1 TEST#2, and TEST#3 are performed.

When the storage operation unit 354 is coupled to the output terminal of the first failure information storage unit 310 through the operation of the output selection unit 352, the storage operation unit 354 compares the N pieces of failure information FAIL_INFO#1<1:N> or FAIL_INFO#3<1:N> stored in the first failure information storage unit 310 to the M pieces of failure information FAIL_INFO#T<1:M> stored in the third failure information storage unit 330, selects only the rest failure information REST_FAIL_INFO<1:N-K1> or REST_FAIL_INFO<1:N-K2>, which does not overlap the M pieces of failure information FAIL_INFO#T<1:M>, from the N pieces of failure information FAIL_INFO#1<1:N> or FAIL_INFO#3<1:N> stored in the first failure information storage unit 310, and stores the selected information in the third failure information storage unit 330. Then, to the storage operation unit 354 deletes all of the N pieces of failure information FAIL_INFO#1<1:N> or FAIL_INFO#3<1:N> stored in the first failure information storage unit 310. Furthermore, when the storage operation unit 354 is coupled to the output terminal of the second failure information storage unit 320 through the operation of the output selection unit 352, the storage operation unit 354 compares the N pieces of failure information FAIL_INFO#2<1:N> stored in the second failure information storage unit 320 to the M pieces of failure information FAIL_INFO#T<1:M> stored in the third failure information storage unit 330, selects only the rest failure information REST_FAIL_INFO<1:N-K1> or REST_FAIL_INFO<1:N-K2>, which does not overlap the M pieces of failure information FAIL_INFO#T<1:M>, from the N pieces of failure information FAIL_INFO#2<1:N> stored in the second failure information storage unit 320, and stores the selected information in the third failure information storage unit 330. Then, the storage operation unit 354 deletes all of the N pieces of failure information FAIL_INFO#2<1:N> stored in the second failure information storage unit 320.

When the storage operation unit 354 is coupled to the integrated failure information storage unit 310 and 320 through the operation of the output selection unit 352, the storage operation unit 354 compares the N pieces of failure information FAIL_INFO#1<1:N>, FAIL_INFO#2<1:N>, FAIL_INFO#3<1:N> stored in the integrated failure information storage unit 310 and 320 to the M pieces of failure information FAIL_INFO#T<1:M> stored in the third failure information storage unit 330, and selects only the rest failure information REST_FAIL_INFO<1:N-K1> or REST_FAIL_INFO<1:N-K2>, which does not overlap the M pieces of failure information FAIL_INFO#T<1:M>, from the N pieces of failure information FAIL_INFO#1<1:N>, FAIL_INFO#2<1:N>, or FAIL_INFO#3<1:N> stored in the integrated failure information storage unit 310 and 320, and stores the selected information in the third failure information storage unit 330. Then, the storage operation unit 354 deletes all of the N pieces of failure information FAIL_INFO#1<1:N>, FAIL_INFO#2<1:N>, or FAIL_INFO#3<1:N> stored in the integrated failure information storage unit 310 and 320.

For reference, since the embodiment of the present invention is based on the supposition that the number of tests TEST#1, TEST#2, and TEST#3 is set to three, the number of odd-numbered tests TEST#1 and TEST#3 is two and the number of even-numbered test TEST#2 is one. However, this is only an example, and a larger number of tests may be sequentially performed.

The test result processing unit repairs errors, which occurred in a DUT, using the M pieces of failure information FAIL_INFO#T<1:M> stored in the third failure information storage unit 330 after all of the tests TEST#1, TEST#2, and TEST#3 are performed. That is, the test result processing unit operates during a repair period, which is performed after all of the tests TEST#1, TEST#2, and TEST#3 are performed. For example, when information containing failures, which occurred in a plurality of memory cells in a semiconductor memory device such as DDR DRAM, is stored in the third failure information storage unit 330, circuits for repairing the defective memory cells in the DUT with redundancy memory cells may be included in the test result processing unit.

For reference, during the preset period, which needs to be guaranteed for the operation illustrated in FIG. 2 after all of the tests TEST#1, TEST#2, and TEST#3 are performed, the repair period may be set to not overlap the preset period or set to overlap the preset period. For example, when the M pieces of failure information FAIL_INFO#T<1:M> stored in the third failure information storage unit 330 are transmitted to the test result processing unit, the preset period and the repair period may overlap each other when the M pieces of failure information FAIL_INFO#T<1:M> are sequentially transmitted from previously stored failure information. When the M pieces of failure information FAIL_INFO#T<1:M> stored in the third failure information storage unit 330 are transmitted to the test result processing unit, the test result processing unit needs to enter the repair period after the preset period, when the M pieces of failure information FAIL_INFO#T<1:M> are transmitted in parallel at a time. Furthermore, when the preset period and the repair period are set to not overlap each other, the test result processing unit may enter the repair period in a predetermined time after the preset period, as long as the condition that the repair period follows the preset period is maintained.

Except that the N pieces of failure information FAIL_INFO#1<1:N>, FAIL_INFO#2<1:N>, or FAIL_INFO#3<1:N> are alternately stored in the first and second failure information storage units 310 and 320 during the first operation mode, but the N pieces of failure information FAIL_INFO#1<1:N>, FAIL_INFO#2<1:N>, or FAIL_INFO#3<1:N> are stored in the integrated failure information storage unit 310 and 320 during the second operation mode, the first and second embodiments seem to have no difference in operation since the overlapping failure information OVER_FAIL_INFO<1:K> overlapping the information stored in the third failure information storage unit 330 is removed in both of the first and second operation modes.

However, the operations of the first and second operation modes are different from each other, considering that the operation of the input selection unit 340 to store the N pieces of failure information FAIL_INFO#1<1:N>, FAIL_INFO#2<1:N>, or FAIL_INFO#3<1:N> and the operation of the storage selection unit 350 to transfer the N pieces of failure information FAIL_INFO#1<1:N>, FAIL_INFO#2<1:N>, or FAIL_INFO#3<1:N> may not be performed at the same time.

Specifically, during the first operation mode, the operation of the input selection unit 340 to store the N pieces of failure information FAIL_INFO#1<1:N>, FAIL_INFO#2<1:N>, or FAIL_INFO#3<1:N> in the first failure information storage unit 310 may be performed during the operation of the storage selection unit 350 to transfer the N pieces of failure information FAIL_INFO#1<1:N>, FAIL_INFO#2<1:N>, or FAIL_INFO#3<1:N> stored in the second failure information storage unit 320. Thus, while the plurality of tests TEST#1, TEST#2, and TEST#3 are sequentially performed in the first operation mode, a separate address transmission operation does not need to be performed between the respective tests.

In the second operation mode, however, while the input selection unit 340 stores the N pieces of failure information FAIL_INFO#1<1:N>, FAIL_INFO#2<1:N>, or FAIL_INFO#3<1:N> in the integrated failure information storage unit 310 and 320, the storage selection unit 350 may not operate, and while the storage selection unit 350 transfers the N pieces of failure information FAIL_INFO#1<1:N>, FAIL_INFO#2<1:N>, or FAIL_INFO#3<1:N> stored in the integrated failure information storage unit 310 and 320, the input selection unit 340 may not operate. Thus, when the plurality of tests TEST#1, TEST#2, and TEST#3 are sequentially performed in the second operation mode, a separate address transmission operation needs to be performed between the respective tests.

Thus, in the second operation mode, the plurality of tests TEST#1, TEST#2, and TEST#3 may be normally performed even through the number of N pieces of failure information FAIL_INFO#1<1:N>, FAIL_INFO#2<1:N>, or FAIL_INFO#3<1:N> exceeds the maximum value, which may be set in the first operation mode. The time required for sequentially performing the plurality of tests TEST#1, TEST#2, and TEST#3 in the second operation mode becomes larger than the time required for sequentially performing the plurality of tests TEST#1 TEST#2 and TEST#3 in the first operation mode.

FIG. 3B illustrates an operation state in which the first and second failure information storage units 310 and 320 are separated from each other in the first operation mode. Thus, the operation is in the same state as the test operation of the semiconductor in accordance with the first embodiment of the present invention, which has been described with reference to FIGS. 2B to 2E. Therefore, the detailed descriptions thereof are omitted herein.

FIG. 3C illustrates an operation state in which the first and second failure information storage units 310 and 320 are coupled to each other and set to the integrated failure information storage unit in the second operation mode.

Specifically, when the plural pieces of first failure information FAIL_INFO#1<1:N> are generated as the result of the first test TEST#1, the plural pieces of first failure information FAIL_INFO#1<1:N> are stored in the integrated failure information storage unit 310 and 320 and then transferred into the third failure information storage unit 330 through an address transmission operation #1. As a result, the M pieces of failure information FAIL_INFO_#T<1:M> stored in the third failure information storage unit 230 may be considered as the plural pieces of first failure information FAIL_INFO#1<1:N> when the first test TEST#1 is ended. Furthermore, after the plural pieces of first failure information FAIL_INFO#1<1:N> are transferred to the third failure information storage unit 330 and then stored, the integrated failure information storage unit 310 and 320 is initialized.

Furthermore, when the plural pieces of second failure information FAIL_INFO#2<1:N> are generated as the result of the second test TEST#2, the plural pieces of second failure information FAIL_INFO#2<1:N> are stored in the integrated failure information storage unit 310 and 320 and then transferred into the third failure information storage unit 330 through an address transmission operation #2. Since the plural pieces of first failure information FAIL_INFO#1<:N> are already stored in the third failure information storage unit 330, only the first rest information REST_FAIL_INFO<1:N-K1> is additionally stored in the third failure information storage unit 330. The first rest information REST_FAIL_INFO<1:N-K1> may be obtained by excluding the overlapping failure information OVER_FAIL_INFO<1:K1>, which overlaps the plural pieces of first failure information FAIL_INFO#1<1:N>, from the plural pieces of second failure information FAIL_INFO#2<1:N>. Thus, first overlap-removed failure information FAIL_INFO<1:2N-K1> is stored in the third failure information storage unit 330. The first overlap-removed failure information FAIL_INFO<1:2N-K1> may be obtained by combining the first rest failure information REST_FAIL_INFO<1:N-K1> and the N pieces of failure information FAIL_INFO#1<1:N> generated as the result of the first test TEST#1. As a result, the M pieces of failure information FAIL_INFO#T<1:N>, stored in the third failure information storage unit 330 when the second test TEST#2 is ended, may be considered as the first overlap-removed failure information FAIL_INFO<1:2N-K1>. Furthermore, after the plural pieces of second failure information FAIL_INFO#2<1:N> are transferred into the third failure information storage unit 330 and then stored, the integrated failure information storage unit 310 and 320 is initialized.

Furthermore, when the plural pieces of third failure information FAIL_INFO#3<1:N> are generated as the result of the third test TEST#3, the plural pieces of third failure information FAIL_INFO#3<1:N> are stored in the integrated failure information storage unit 310 and 320 and then transferred into the third failure information storage unit 330 at a preset period. Since the first overlap-removed failure information FAIL_INFO<1:2N-K1> is already stored in the third failure information storage unit 330, only second rest failure information REST_FAIL_INFO<1:N-K2> is additionally stored in the third failure information storage unit 330. The second rest failure information REST_FAIL_INFO<1:N-K2> may be obtained by excluding the overlapping failure information OVER_FAIL_INFO<1:K2>, which overlaps the first overlap-removed failure information FAIL_INFO<1:2N-K1>, from the plural pieces of third failure information FAIL_INFO#3<1:N>.

Thus, second overlap-removed failure information FAIL_INFO<1:3N-K1-K2> is stored in the third failure information storage unit 230. The second overlap-removed failure information FAIL_INFO<1:3N-K1-K2> may be obtained by combining the second rest failure information REST_FAIL_INFO<1:N-K2> and the first overlap-removed failure information FAIL_INFO<1:3N-K1>. As a result, the M pieces of failure information FAIL_INFO#T<1:M>, stored in the third failure information storage unit 230 when the third test TEST#3 is ended, may be considered as the second overlap-removed failure information FAIL_INFO<1:3N-K1-K2>. Furthermore, after the plural pieces of third failure information FAIL_INFO#3<1:N> are transferred into the third failure information storage unit 330 and then stored, the integrated failure information storage unit 310 and 320 is initialized.

As described above, when the second embodiment of the present invention is applied to an integrated circuit 300, the plural pieces of failure information FAIL_INFO#1<1:N>, FAIL_INFO#2<1:N>, or FAIL_INFO#3<1:N> occurring in each of the tests TEST#1, TEST#2, and TEST#3 are alternately stored in the two different storage spaces 310 and 320, when the plurality of tests TEST#1, TEST#2, and TEST#3 are sequentially and intensely performed. Then, when the plural pieces of failure information FAIL_INFO#1<1:N>, FAIL_INFO#2<1:N>, or FAIL_INFO#3<1:N> stored in each of the two storage spaces 210 and 220 are transferred into the third storage space 230, the overlapping failure information OVER_FAIL_INFO<1:K> is removed. Thus, the overlapping failure information OVER_FAIL_INFO<1:K> is contained in the third storage space 230 only once. Therefore when the plurality of tests TEST#1, TEST#2, and TEST#3 are performed, the space for storing the plural pieces of failure information FAIL_INFO#1<1:N>, FAIL_INFO#2<1:N>, or FAIL_INFO#3<1:N> may be minimized.

Furthermore, the two storage spaces each capable of storing the plural pieces of failure information FAIL_INFO#1<1:N>, FAIL_INFO#2<1:N>, or FAIL_INFO#3<1:N> may be controlled to be used as one integrated storage space according to the operation mode. Thus, even when the number of pieces of failure information FAIL_INFO#1<1:N>, FAIL_INFO#2<1:N>, or FAIL_INFO#3<1:N> exceeds an expected number, the test operation may be normally performed. Therefore, when the plurality of tests TEST#1, TEST#2, and TEST#3 are performed, the space for storing the plural pieces of failure information FAIL_INFO#1<1:N>, FAIL_INFO#2<1:N>, or FAIL_INFO#3<1:N> may be minimized and efficiently used.

Although various embodiments have been described for illustrative purposes, it will be apparent to those skilled in the art that various changes and modifications may be made without departing from the spirit and scope of the invention as defined in the following claims.

What is claimed:
1. An integrated circuit comprising:
first to third failure information storage units;
an input selection unit suitable for alternately storing plural pieces of failure information in the first and second failure information storage units, generated whenever each of a plurality of tests is performed on a device under test (DUT); and a storage selection unit suitable for relocating the plural pieces of failure information from the first or second failure information storage unit that was not selected by the input selection unit, to the third failure information storage unit while excluding overlapping failure information from relocating.

2. The integrated circuit of claim 1, wherein the storage selection unit selects the first or second failure information storage unit in the opposite manner to selection of the input selection unit whenever each of the tests is performed on the DUT, and transfers and stores the plural pieces of failure information stored in the selected failure information storage unit into the third failure information storage unit, wherein the overlapping failure information is stored only one time.

3. The integrated circuit of claim 2, wherein the storage selection unit stores rest failure information, obtained by excluding the overlapping failure information that overlaps the plural pieces of failure information stored in the third failure information storage unit from the plural pieces of failure information stored in the selected failure information storage unit, in the third failure information storage unit and then initializes the selected failure information storage unit.

4. The integrated circuit of claim 2, wherein the storage selection unit comprises:
an output selection unit suitable for selecting the first or second failure information storage unit in the opposite manner to selection of the input selection unit whenever each of the tests is performed on the DUT, and selecting the failure information storage unit, which is selected by the input selection unit when the last test is performed on the DUT, between the first and second failure information storage units after all of the tests are performed on the DUT; and
a storage operation unit suitable for comparing the plural pieces of failure information stored in the failure information storage unit selected by the output selection unit to the plural pieces of failure information stored in the third failure information storage unit, and storing rest failure information, obtained by excluding the overlapping failure information according to the comparison result, in the third failure information storage unit.

5. The integrated circuit of claim 4, wherein the input selection unit stores plural pieces of failure information, generated whenever an odd-numbered test among the plurality of tests is performed on the DUT, in the first failure information storage unit and stores plural pieces of failure information, generated whenever an even-numbered test among the plurality of tests is performed on the DUT, in the second failure information storage unit.

6. The integrated circuit of claim 5, wherein, whenever an to even-numbered test among the plurality of tests is performed on the DUT, the output selection unit couples an output terminal of the first failure information storage unit to the storage operation unit and does not couple an output terminal of the second failure information storage unit to the storage operation unit,
whenever an odd-numbered test among the plurality of tests is performed on the DUT, the output selection unit couples the output terminal of the second failure information storage unit to the storage operation unit and does not couple the output terminal of the first failure information storage unit to the storage operation unit,
when the last test among the plurality of tests is an odd-numbered test, the output selection unit couples the output terminal of the first failure information storage unit to the storage operation unit and does not couple the output terminal of the second failure information storage unit to the storage operation unit, at a preset period after all of the tests are performed on the DUT, and
when the last test among the plurality of tests is an even-numbered test, the output selection unit couples the output terminal of the second failure information storage unit to the storage operation unit and does not couple the output terminal of the first failure information storage unit to the storage operation unit, at the preset period after all of the tests are performed on the DUT.

7. The integrated circuit of claim 6, wherein, when the storage operation unit is coupled to the output terminal of the first failure information storage unit through the operation of the output selection unit, the storage operation unit compares the plural pieces of failure information stored in the first failure information storage unit to the plural pieces of failure information stored in the third failure information storage unit, selects only failure information, which does not overlap the plural pieces of failure information stored in the third failure information storage unit, from the plural pieces of failure information stored in the first failure information storage unit, stores the selected information in the third failure information storage unit, and then deletes all of the plural pieces of failure information stored in the first failure information storage unit.

8. The integrated circuit of claim 6, wherein, when the storage operation unit is coupled to the output terminal of the second failure information storage unit through the operation of the output selection unit, the storage operation unit compares the plural pieces of failure information stored in the second failure information storage unit to the plural pieces of failure information stored in the third failure information storage unit, selects only failure information which does not overlap the plural pieces of failure information stored in the third failure information storage unit, from the plural pieces of failure information stored in the second failure information storage unit, stores the selected information in the third failure information storage to unit, and then deletes the plural pieces of failure information stored in the second failure information storage unit.

9. An integrated circuit comprising:
first to third failure information storage units;
an input selection unit suitable for alternately storing plural pieces of failure information in the first and second failure information storage units, generated whenever each of a plurality of tests is performed on a device under test (DUT) during a first operation mode; and
a storage selection unit suitable for relocating the plural pieces of failure information from the first or second failure information storage unit that was not selected by the input selection unit, to the third failure information storage unit while excluding overlapping failure information from relocating, during the first operation mode.

10. The integrated circuit of claim 9, wherein the storage selection unit selects the first or second failure information storage unit in the opposite manner to selection of the input selection unit whenever each of the tests is performed on the DUT, and transferring and storing the plural pieces of failure information stored in the selected failure information storage unit into the third failure information storage unit, wherein overlapping failure information that overlaps the plural pieces of failure information stored in the third failure information storage unit is stored only once, during the first operation mode.

11. The integrated circuit of claim 10, wherein, when an output terminal of the first failure information storage unit is coupled to an input terminal of the second failure information storage unit or an output terminal of the second failure information storage unit is coupled to an input terminal of the first failure information storage unit during a second operation mode in which the first and second failure information storage units are set to an integrated failure information storage unit, the input selection unit stores the plural pieces of failure information in the integrated failure information storage unit, generated whenever each of the tests is performed on the DUT.

12. The integrated circuit of claim 11, wherein, during the first operation mode, the storage selection unit stores rest failure information, obtained by excluding the overlapping failure information from the plural pieces of failure information stored in the selected failure information storage unit, in the third failure information storage unit and then initializes the selected failure information storage unit, and during the second operation mode, the storage selection unit stores rest failure information, obtained by excluding the overlapping failure information from the plural pieces of failure information stored in the integrated failure information storage unit, in the third failure information storage unit and then initializes the integrated failure information storage unit.

13. The integrated circuit of claim 11, wherein the storage selection unit comprises:

an output selection unit suitable for selecting the first or second failure information storage unit in the opposite manner to selection of the input selection unit whenever each of the tests is performed on the DUT during the first operation mode, selecting the failure information storage unit, which is selected by the input selection unit when the last test is performed on the DUT, between the first and second failure information storage units after all of the tests are performed on the DUT, and selecting the integrated failure information storage unit in the second operation mode; and a storage operation unit suitable for comparing the plural pieces of failure information stored in the failure information storage unit selected by the output selection unit to the plural pieces of failure information stored in the third failure information storage unit, and storing rest failure information, obtained by excluding the overlapping failure information according to the comparison result, in the third failure information storage unit.

14. The integrated circuit of claim 13, wherein the input selection unit stores plural pieces of failure information in the first failure information storage unit, generated whenever an odd-numbered test among the plurality of tests is performed on the DUT during the first operation mode, stores plural pieces of failure information in the second failure information storage unit, generated whenever an even-numbered test among the plurality of tests is performed on the DUT during the first operation mode, and stores plural pieces of failure information in the integrated failure information storage unit, generated whenever each of the tests is performed on the DUT during the second operation mode.

15. The integrated circuit of claim 14, wherein, whenever an even-numbered test among the plurality of tests is performed on the DUT during the first operation mode, the output selection unit couples an output terminal of the first failure information storage unit to the storage operation unit and does not couple an output terminal of the second failure information storage unit to the storage operation unit, whenever an odd-numbered test among the plurality of tests is performed on the DUT during the first operation mode, the output selection unit couples the output terminal of the second failure information storage unit to the storage operation unit and does not couple the output terminal of the first failure information storage unit to the storage operation unit, when the last test among the plurality of tests is an odd-numbered test during the first operation mode, the output selection unit couples the output terminal of the first failure information storage unit to the storage operation unit and does not couple the output terminal of the second failure information storage unit to the storage operation unit, at a preset period after all of the tests are performed on the DUT, when the last test among the plurality of tests is an even-numbered test during the first operation mode, the output selection unit couples the output terminal of the second failure information storage unit to the storage operation unit and does not couple the output terminal of the first failure information storage unit to the storage operation unit, at the preset period after all of the tests are performed on the DUT, and whenever each of the tests is performed on the DUT during the second operation mode, the output selection unit couples an output terminal of the integrated failure information storage unit to the storage operation unit at a preset period after all of the tests are performed on the DUT.

16. The integrated circuit of claim 15, wherein, when the storage operation unit is coupled to the output terminal of the first failure information storage unit through the operation of the output selection unit, the storage operation unit compares the plural pieces of failure information stored in the first failure information storage unit to the plural pieces of failure information stored in the third failure information storage unit, selects only failure information, which does not overlap the plural pieces of failure information stored in the third failure information storage unit, from the plural pieces of failure information stored in the first failure information storage unit, stores the selected information into the third failure information storage unit, then deletes all of the plural pieces of failure information stored in the first failure information storage unit.

17. The integrated circuit of claim 15, wherein, when the storage operation unit is coupled to the output terminal of the second failure information storage unit through the operation of the output selection unit, the storage operation unit compares the plural pieces of failure information stored in the second failure information storage unit to the plural pieces of failure information stored in the third failure information storage unit, selects only failure information which does not overlap the plural pieces of failure information stored in the third failure information storage unit, from the plural pieces of failure information stored in the second failure information storage unit, stores the selected information in the third failure information storage unit, and then deletes the plural pieces of failure information stored in the second failure information storage unit.

18. The integrated circuit of claim 15, wherein, when the storage operation unit is coupled to the output terminal of the integrated failure information storage unit through the operation of the output selection unit, the storage operation unit compares the plural pieces of failure information stored in the integrated failure information storage unit to the plural pieces of failure information stored in the third failure information storage unit, selects only failure information which does not overlap the plural pieces of failure information stored in the third failure information storage unit, from the plural pieces of failure information stored in the integrated failure information storage unit, stores the selected information in the third failure information storage unit, then deletes the plural pieces of failure information stored in the integrated failure information storage unit.

19. A method of testing a semiconductor device, the method comprising:

storing plural pieces of failure information in a first failure information storage space, generated whenever an odd-numbered test among a plurality of tests is performed on the semiconductor device;

storing plural pieces of failure information in a second failure information storage space, generated whenever an even-numbered test among the plurality of tests is performed on the semiconductor device;

relocating the plural pieces of failure information stored in the second failure information storage space to a third failure information storage space when the plural pieces of failure information are stored in the first failure information storage space, wherein overlapping failure information that overlaps the plural pieces of failure information stored in the third failure information storage space is stored only once; and relocating the plural pieces of failure information stored in the first failure information storage space to the third failure information storage space when the plural pieces of failure information are stored in the second failure information storage space, wherein overlapping failure information that overlaps the plural pieces of failure information stored in the third failure information storage space is stored only once.

20. The method of claim 19, wherein, when the last test among the plurality of tests is an odd-numbered test, the plural pieces of failure information stored in the first failure information storage space is relocated to the third failure information storage space after all of the tests are performed on the semiconductor device, wherein overlapping failure information that overlaps the plural pieces of failure information stored in the third failure information storage space is stored only once, and when the last test among the plurality of tests is an even-numbered test, the plural pieces of failure information stored in the second failure information storage space is relocated to the third failure information storage space after all of the tests are performed on the semiconductor device, wherein overlapping failure information that overlaps the plural pieces of failure information stored in the third failure information storage space is stored only once.

* * * * *